FREQUENCY CONTROL

Filed May 6, 1964 2 Sheets-Sheet 1

INVENTOR
GILBERT YANISHEVSKY
BY Vincent L. Carney
ATTORNEY

FREQUENCY CONTROL

Filed May 6, 1964

INVENTOR.
GILBERT YANISHEVSKY
BY
Vincent L. Carney
ATTORNEY

United States Patent Office 3,401,386
Patented Sept. 10, 1968

3,401,386
FREQUENCY CONTROL

Gilbert Yanishevsky, Philadelphia, Pa., assignor to Burroughs Corporation, Detroit, Mich., a corporation of Michigan Filed May 6, 1964, Ser. No. 365,276
9 Claims. (Cl. 340—347)

ABSTRACT OF THE DISCLOSURE

Relaxation oscillator apparatus in which the frequency of oscillation is controlled by the application of digital input words which control, either directly or indirectly through decoding means, the supply of additive current of preset magnitudes into the feedback path of the oscillator and thereby establish the period of oscillation as a preselected function of the input words.

This invention relates to a system for controlling the frequency of an oscillator and more particularly, relates to a system by which the repetition rate of a relaxation oscillator may be controlled by digital input signals.

It is frequently desirable to alter the frequency or repetition rate of a generator in response to a digital input signal. For example, in a constant velocity character generator in which the length of lines displayed on a cathode ray tube are determined by digital signals stored in a computer, the line lengths are controlled by changing the frequency of clock pulses applied to a line-drawing timing control for the cathode ray tube. Such a character generator is described in the application of Charles P. Halsted, entitled, "Symbol Generating Apparatus," Ser. No. 277,796, filed May 3, 1963, and assigned to the same assignee as this application.

The clock pulses for many purposes are generated by relaxation oscillators. The frequency of these relaxation oscillators is commonly controlled by changing the resistance, capacitance, or voltage in the frequency-determining circuitry of the relaxation oscillator. These three methods of controlling the frequency of a relaxation oscillator are not readily adaptable to digital control. Accordingly, it is an object of this invention to provide an improved system for controlling the frequency of a relaxation oscillator.

It is a further object of this invention to provide a system by which the frequency of a relaxation oscillator may be controlled directly by a digital signal.

It is a further object of this invention to provide a system for controlling the frequency of a relaxation oscillator quickly over a wide range and from a remote location.

It is a still further object of this invention to provide a system by which the frequency of a relaxation oscillator may be controlled by constant-current sources which are switched on and off in response to digital signals.

In accordance with the above objects a blocking oscillator for generating clock pulses is provided having a capacitor in its regenerative feedback loop for the control of the frequency of the blocking oscillator. A plurality of constant current sources are electrically connected to this control capacitor. These constant current sources are switched on and off by a diode decoding circuit in response to a digital input. The added current from the constant current sources supplements the current fed back from the regenerative feedback loop of the blocking oscillator so as to alter the frequency of the blocking oscillator.

The above-noted and other features of the invention will be understood more clearly and fully from the following detailed description when considered with reference to the accompanying drawings in which.

Figure 1:
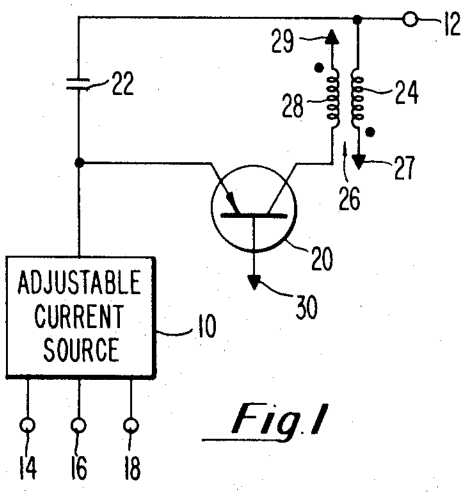
FIGURE 1 is a schematic circuit diagram of a blocking oscillator illustrating the manner in which its frequency is controlled.

In FIGURE 1 a schematic circuit diagram of a blocking oscillator is shown having adjustable current source 10 for controlling the frequency of output voltage pulses on an output terminal 12 in response to a binary word applied to the terminals 14, 16 and 18 as parallel bits to the adjustable current source 10. The output of the adjustable current source 10 is electrically connected to the emitter of a PNP 2N705 transistor 20 and to one plate of the capacitor 22. The other plate of the capacitor 22 is electrically connected to the output terminal 12 and to one end of the winding 24 on the blocking oscillator transformer 26. The other end of the winding 24 is electrically connected to a source of a negative 4.5 volts. The collector of the transistor 20 is electrically connected to one end of the other winding 28 of the transformer 26. The winding 28 is wound in the opposite direction as the winding 24 and it is electrically connected at its other end to a source of a negative 15 volts 29. The base of the transistor 20 is electrically connected to a source of a negative 6 volts 30.

When the blocking oscillator is energized, the transistor 20 begins to conduct due to the negative voltage 30 applied to the base and to the negative voltage 29 applied to the collector of the transistor 20. The current flowing through the transistor 20 flows through the winding 28 of the transformer 26 inducing a voltage of opposite polarity in the winding 24. This voltage causes current to flow through the capacitor 22 charging this capacitor and driving the transistor 20 further into the conduction region. This regenerative process continues rapidly until the transistor 20 is saturated.

When the transistor 20 is saturated, the current from its collector through the transformer winding 28 becomes constant so that no further voltage is induced in the winding 24. The charging potential is now no longer applied across the condenser 22 from the winding 24. This condenser begins to discharge, inducing a voltage in winding 28 which decreases the collector voltage of transistor 20. The transistor current begins to decrease and induces a voltage in winding 24 that causes it to become nonconducting. The transistor 20 remains in its non-conducting state until the capacitor 22 is completely discharged and its emitter again becomes positive with respect to the base.

The time required for the condenser 22 to discharge so as to initiate the conduction of transistor 20 is effected by current applied to the condenser from the adjustable current source 10. The amount of this current is determined by the binary inputs to the terminals 14, 16 and 18. It can be seen, then, that the binary signal inputs to the terminals 14, 16 and 18 determine the frequency of oscillation of the blocking oscillator 20. It is to be noted that the transistor 20 is partially controlled through its alpha rather than entirely through its beta as is commonly the case. This increases its stability.

Figure 2:
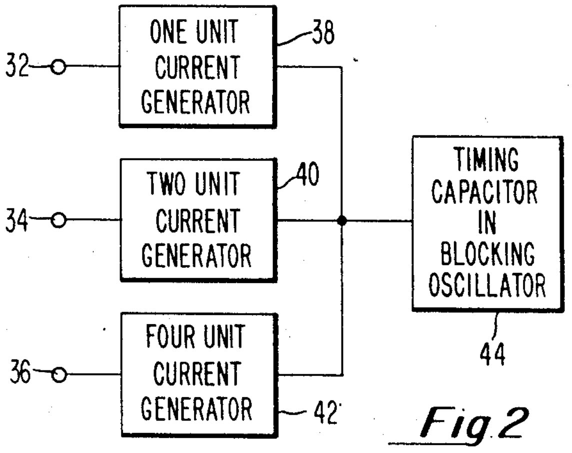
FIGURE 2 is a block diagram illustrating a system for controlling the frequency of a blocking oscillator in response to a digital signal.

In FIGURE 2 a block diagram is shown of an arrangement for controlling the frequency of a blocking oscillator in proportion to the "weight" of a digital input signal having a terminal 32 for receiving a $2^0$ binary bit, a terminal 34 for receiving a $2^1$ binary bit and a terminal 36 for receiving a $2^2$ binary bit. The input terminal 32 is electrically connected to the one-unit current generator 38 which generates one unit of current in response to an input on the $2^0$ input terminal; the terminal 34 is electrically connected to a two-unit current generator 40 which generates two units of current in response to a voltage received on the $2^1$ input terminal; and terminal 36 is electrically connected to the four-unit current generator 42 which generates four units of current in response to a voltage received on the $2^2$ input terminal.

The outputs from the current generators 38, 40 and 42 are each electrically connected to the timing capacitor indicated as 22 in FIGURE 1 and indicated by the block 44 in FIGURE 2. It can be seen that the currents from the constant-current generators 38, 40 and 42 are additive so that if a binary "one" in received from terminal 32 and another binary "one" on terminal 36, the timing capacitor for the blocking oscillator 44 receives five units of current so as to be proportional to the coded "weight" of the input binary signals.

Figure 3:
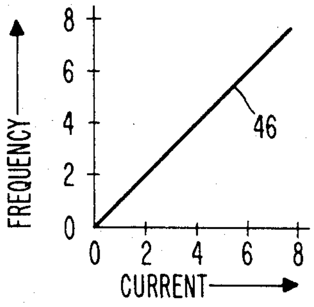
FIGURE 3 is a graph having abscissas of current and ordinates of frequency for the system of FIGURE 2.

In FIGURE 3 a graph is shown having ordinates of frequency and abscissas of current received by the timing capacitor from the current generators. The curve 46 is approximately a straight line starting at the origin and extended so as to always be an equal number of units from the two axes of the graph.

Figure 4:
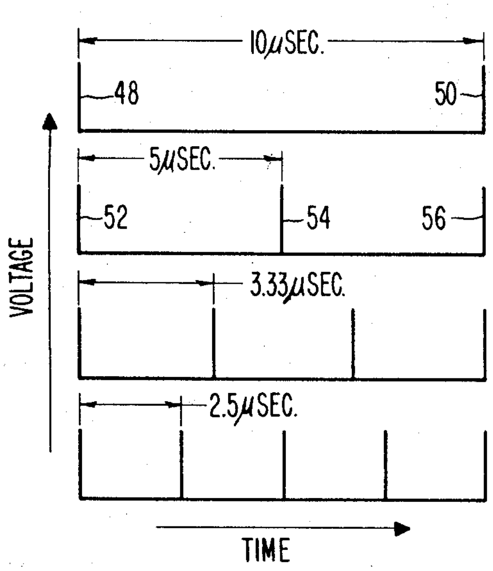
FIGURE 4 is a graph of the output voltage pulses from the blocking oscillator showing the timing of the voltage pulses at different values of current input to the control capacitor of the blocking oscillator in curves one under the other having common abscissas of time and individual ordinates of voltage for each value of current.

In FIGURE 4 a graph is shown having timing lines representing output pulses from a blocking oscillator with four separate ordinates representing four different currents and frequencies and having a common abscissa of time. A top line shows two output pulses 48 and 50 of a blocking oscillator occurring with a period or repetition rate of ten microseconds. This represents a frequency of 0.1 megacycle and occurs when one unit of current is being applied from the constant current generators to the timing capacitor of the blocking oscillator. The second line has three pulses 52, 54 and 56 occuring five microseconds apart so as to have a frequency of 0.2 megacycle. Pulses of this frequency are provided by the blocking oscillator when it receives two units of current from the constant current generators. The fourth line shows four pulses occuring 3.3 microseconds apart representing the output from the blocking oscillator when it receives 3 units of current on its timing capacitor and the fourth line shows five timing pulses 2.5 microseconds apart representing the output from the blocking oscillator when its timing capacitor receives four units of current.

From these curves it can be seen that each time the current from the constant current generators to the timing capacitor is doubled, the frequency is doubled and the repetition rate or period is reduced by a factor of two. It is clear that each time the "weight" of the digital control word is increased by a binary "one" the repetition rate or period changes by a different value. For example, a change from one unit of current to two units of current reduces the repetition rate by five microseconds, but a change from two units of current to three units of current reduces the repetition rate by only 1.67 microseconds.

Figure 5:
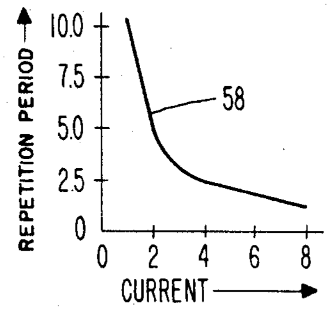
FIGURE 5 is a graph showing the variation in the repetition rate with respect to the charging current in the timing capacitor of the blocking oscillator.

In FIGURE 5 a graph is shown having a curve 58 and having ordinates of repetition rate or period and abscissa of current. It can be seen that repetition rate is not linear with respect to the current. One way of correcting this is shown in FIGURE 6.

Figure 6:
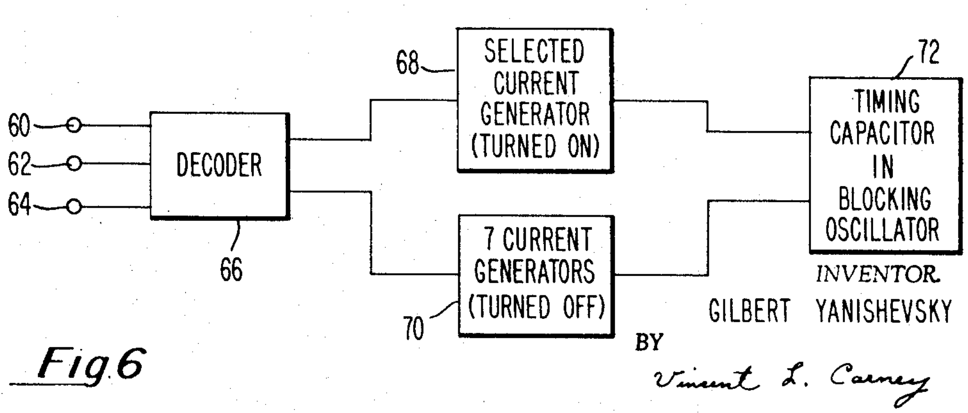
FIGURE 6 is a block diagram of a circuit in which a binary input word controls the repetition rate of the blocking oscillator.

In FIGURE 6 a block diagram is shown illustrating a system for causing the repetition rate or period of a blocking oscillator to vary directly with the "weight" of a digital input word having input terminals 60, 62 and 64 for receiving voltages representing $2^0$, $2^1$, and $2^2$ bits of information in binary form. Terminals 60, 62 and 64 are electrically connected to the decoder 66 which decodes the three-bit word into its eight possible configurations. Each of the eight configurations is gated to a different current generator. Since only one word can be decoded at a time, only one current generator can be turned on at a time. This selected current generator controls the repetition rate of the blocking oscillator and is therefore adjusted to have the proper current to frequency relationship, substantially as indicated in the curve of FIGURE 3. In FIGURE 6 the decoder 66 is shown as being electrically connected to one selected current generator 68 that is turned on and to the remaining seven current generators that are turned off. All of the current generators are electrically connected to the timing capacitor in the blocking oscillator 72.

Figure 7:
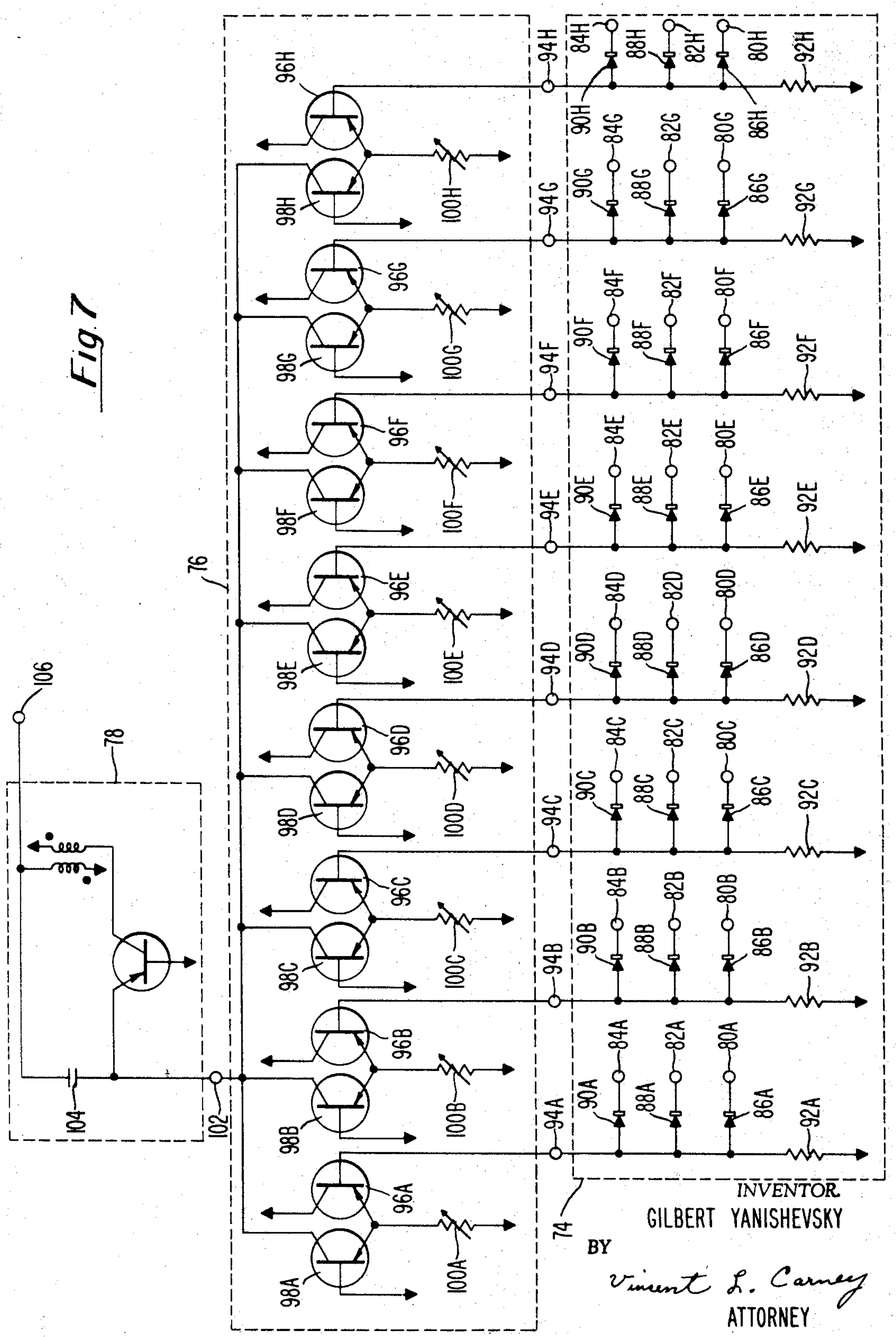
FIGURE 7 is a schematic circuit diagram of an embodiment of the invention.

In FIGURE 7 a schematic circuit diagram of apparatus for providing output pulses the periods of which are directly proportional to the "weight" of a three bit digital word, such as that shown in block diagram form in FIGURE 6, is shown having a decoder indicated generally at 74, a constant current generator section indicated generally at 76, and a blocking oscillator section indicated generally at 78.

The decoder section includes eight input terminals 80A–80H for receiving the $2^0$ binary bits, eight input terminals 82A–82H for receiving $2^1$ binary bits, and eight input terminals 84A–84H for receiving the $2^2$ binary bits. Each of the eight input terminals 80A–80H is electrically connected to the cathode of a different one of the corresponding eight diodes 86A–86H; each of the eight input terminals 82A–82H is electrically connected to the cathode of a different one of the corresponding eight diodes 88A–88H; and each of the eight input terminals 84A–84H is electrically connected to the cathode of a different one of the corresponding eight diodes 90A-90H. Each of eight resistors 92A–92H is electrically connected at one end to a source of a positive 15 volts and is electrically connected at the other end to the anodes of the three diodes forming a corresponding set of three diodes of the eight sets of diodes 86A, 88A, 90A, 86H, 88H and 90H, and to a corresponding one of the eight decoder output terminals 94A–94H.

The decoder circuit 74 includes eight AND gates each having three diodes and three input terminals. These AND gates are adapted to receive each of the possible combinations of the three-bit word so that for any one combination one AND gate is opened. For any AND gate that is not selected, the output terminal of the output terminals 94A–94H close to ground potential. The inputs to the decoder circuit consist of binary "ones" having a voltage level of a positive three volts and binary "zeros" having a ground voltage level. Each possible word provides a positive three volts to all three of the input terminals on only one of the AND gates causing the corresponding output terminal of the output terminals 94A–94H to increase to a positive three volts.

Each of the decoder output terminals 94A–94H is electrically connected to the base of a corresponding one of the eight PNP transistors 96A–96H. The emitter of each of the transistors 96A–96H is electrically connected to the emitter of a corresponding one of the eight PNP transistors 98A–98H, and to a source of positive 15 volts through a corresponding one of the eight potentiometers 100A–100H. Each of the bases of the transistors 98A–98H is electrically connected to a positive source of 1.5 volts; the collectors of each of the transistors 96A–96H are electrically connected to a source of a negative 6 volts. The collectors of each of the eight transistors 98A–98H are electrically connected to input terminal 102 of the blocking oscillator circuit 78.

The eight transistor pairs 96A, 98A–96H, 98H form eight constant current generators each of which is connected to one of the output terminals 94A–94H of the decoder 74 and each of which is electrically connected to the terminal 102. This terminal provides the current from the constant current generator 76 to the blocking oscillator 78 so as to determine its repetition rate. The potentiometers 100A–100H are each individually adjusted so as to provide the proper amount of current to terminal 102 when that individual constant current generator is selected by an output pulse from the decoder on one of the terminals 94A–94H. In each of the unselected current generators the corresponding one of the transistors 96A–96H in that transistor pair is conducting since its emitter is slightly positive and its base is near ground level. The other transistor of the transistor 98A–98H in each transistor pair is cut-off since its emitter voltage is not sufficiently positive with respect to its base voltage of a positive 1.5 volts.

However, when a positive three volts appears at a corresponding one of the terminals 94A–94H the selected one of the transistors 96A–96H is cut off by the positive three volts causing the emitter voltage of the other transistor 98A–98H in the transistor pair to rise in a positive direction, driving this transistor into conduction so as to provide its output current to the terminal 102. The amount of current is determined by the magnitude of the resistance of the corresponding one of the potentiometers 100A–100H.

The current flowing through the terminal 102 is applied to the timing capacitor 104 of the blocking oscillator 78. The blocking oscillator 78 is substantially the same as that shown in FIGURE 1 and described above. The charging current on the timing capacitor 104 controls the repetition rate of the blocking oscillator so as to control the repetition rate of the voltage pulses which occur at the output terminal 106.

It can be seen that the above circuit provides a system for controlling the repetition rate or the frequency of a blocking oscillator with all-digital control and with no digital-to-analog converter. The frequency or repetition rate is instantly variable: each successive cycle of the blocking oscillator may have a different time constant than the preceding cycle.

Furthermore, there is a wide range of possible time constants. The frequency may be controlled from a remote computer. It is relatively noise free. A blocking oscillator is inherently less susceptible to noise than other circuits and with this type of emitter-current control it it inherently more stable since the frequency is partially controlled by the alpha of the transistor rather than by the beta.

Obviously, many modifications and variations of the instant invention are possible in the light of the above teachings. It is therefore to be understood that within the scope of the appended claims the invention may be prac'iced otherwise than as specifically described.

What is claimed is:

1. The combination comprising:

electrical means for generating electrical oscillations;

said electrical means having an output circuit and a control circuit;

said electrical means including an electric-charge storage means for coupling said output circuit to said control circuit, for controlling the oscillations of said electrical means through said control circuits;

a plurality of constant-current generator means, each for independently adding electric charge to said storage means;

each of said constant-current generator means having an input terminal and an output terminal with said output terminal electrically connected to said storage means; and each of said current generator means individually providing a different predetermined value of current to its output terminal when receiving a binary signal on its input terminal for controlling the repetition rate of said electrical means responsive to different digital signals.

2. The combination according to claim 1 in which each of said plurality of constant-current generator means corresponds to a different binary word, for providing a magnitude of current to said storage means causing the period of oscillation to be linearly proportional to the "weight" of different binary words; and decoding means, for electrically connecting to said storage means that one of said plurality of constant current generator means which corresponds to the "weight" of the binary word received by said decoding means.

3. Apparatus for providing a periodic output voltage having a period proportional to the "weight" of a digital input word having a plurality of bits, comprising:

a relaxation oscillator;

said relaxation oscillator including a capacitor for controlling the frequency of oscillation of said relaxation oscillator by storing charges;

a plurality of constant-current generators each being electrically connected to said capacitor and each having an input terminal for receiving a different input word which is capable of turning on said constant current generator; and each of said constant-current generators individually providing to the capacitor an amount of current corresponding to the input word that its input terminal is adapted to receive for effecting a period proportional to the digital word.

4. Apparatus for providing a periodic output voltage the repetition period of which is proportional to the "weight" of an input digital signal, comprising:

a relaxation oscillator;

said relaxation oscillator including a feedback capacitor for controlling the repetition rate of said relaxation oscillator by storing electrical charges;

a plurality of constant-current generators each being electrically connected to said capacitor;

each of said constant-current generators being preset for providing an output current proportional to one preselected repetition rate of said periodic output voltage; and decoding means, electrically connected to said plurality of constant current generators, for receiving said digital signal and for turning on that constant current generator whose current corresponds in the present relation to the value of the input digital signal.

5. Apparatus for providing a periodic voltage output the repetition period of which is proportional to the "weight" of an input digital signal according to claim 4 in which said relaxation oscillator is a blocking oscillator and the generator currents are linearly proportional to the preselected repetition periods of said periodic output voltage.

6. A digitally controlled blocking oscillator, the repetition period of which is independently controlled by different digital input word values, comprising:

decoder means, having digital word input terminals and having a plurality of output terminals each of which corresponds to one "weight" of a digital word, for receiving said digital word and for pulsing the output terminal which corresponds to the "weight" of said digital word;

a plurality of current-source means for providing a magnitude of current corresponding in a predetermined independently assigned proportion to each said digital word;

a plurality of switch means, each having its output terminal electrically connected to a common output terminal, its control terminal electrically connected to a different one of said plurality of decoder output terminals, and its input terminal electrically connected to the current-source means that corresponds to the one of said decoder output terminals that is electrically connected to its control terminal for electrically connecting its input terminal to its output terminal upon receiving a voltage pulse on its control terminal; and a blocking oscillator having one plate of its timing capacitor electrically connected to said common terminal.

7. A digitally controlled blocking oscillator according to claim 6 in which said blocking oscillator comprises:

a PNP transistor having its base adapted to be connected to a source of negative potential;

a timing capacitor having one plate electrically connected to the emitter of said PNP transistor and to said common terminal;

a transformer having a first winding electrically connected to the collector of said PNP transistor at one end and to a source of negative potential at the other end and having a second winding oppositely wound from said one winding which second winding is electrically connected to the other plate of said capacitor at one end and to a source of negative potential at its other end; and an output terminal electrically connected to said one end of said second winding of said transformer.

8. A digitally controlled blocking oscillator according to claim 7 in which each of said constant current generating means comprises:

a potentiometer adapted to be connected at one end to a source of positive voltage and electrically connected at its other end to one of said switch means.

9. A digitally controlled blocking oscillator according to claim 8 in which each of said switch means comprises:

a first PNP transistor having its emitter electrically connected to one of said potentiometers, having its base electrically connected to one of said decoder output terminals, and having its collector adapted to be connected to a source of negative potential; and a second PNP transistor having its base adapted to be connected to a source of positive voltage, having its emitter electrically connected to one of said potentiometers, and having its collector electrically connected to said common terminal.

References Cited

UNITED STATES PATENTS

| | | | |
|---|---|---|---|
| 2,745,012 | 5/1956 | Felker | 331—112 |
| 3,036,299 | 5/1962 | Uphoff | 307—88.5 |
| 3,040,273 | 6/1962 | Boff | 307—88.5 |
| 3,160,874 | 12/1964 | Hamori | 340—347 |
| 3,175,165 | 3/1965 | Dyahoff | 331—112 |
| 3,187,271 | 6/1965 | De Vries | 331—112 |
| 3,223,994 | 12/1965 | Cates | 340—347 |

MAYNARD R. WILBUR, *Primary Examiner.*

W. J. KOPACZ, *Assistant Examiner.*